United States Patent [19]

Iwasaki

[11] Patent Number: 5,598,347
[45] Date of Patent: Jan. 28, 1997

[54] LAYOUT METHOD FOR DESIGNING AN INTEGRATED CIRCUIT DEVICE BY USING STANDARD CELLS

[75] Inventor: Tadashi Iwasaki, Tokyo, Japan

[73] Assignee: NEC Corporation, Tokyo, Japan

[21] Appl. No.: 279,219

[22] Filed: Jul. 22, 1994

Related U.S. Application Data

[63] Continuation of Ser. No. 54,107, Apr. 27, 1993, abandoned.

[30] Foreign Application Priority Data

Apr. 27, 1992 [JP] Japan ................................ 4-107206

[51] Int. Cl.⁶ ............................ G06F 15/00; H01L 27/10
[52] U.S. Cl. ..................... 364/491; 364/490; 364/489;
364/488; 327/565; 257/202; 257/368; 257/377;
257/206; 365/189.01; 365/189.08; 326/38;
326/39; 326/88; 326/113
[58] Field of Search ................................ 257/204, 205,
257/206, 202, 923, 368, 377, 268, 321;
364/488, 489, 490, 491, 578; 365/189.01,
189.09, 206, 207, 208, 155, 177, 189.08;
326/113, 55, 38, 39, 88; 327/565

[56] References Cited

U.S. PATENT DOCUMENTS

| | | | |
|---|---|---|---|
| 4,622,648 | 11/1986 | Whitaker | 326/113 |
| 4,663,646 | 5/1987 | Ikawa et al. | 257/204 |
| 4,839,710 | 6/1989 | Holzapfel et al. | 257/204 |
| 4,855,954 | 8/1989 | Turner et al. | 326/38 |
| 4,896,296 | 1/1990 | Turner et al. | 326/38 |
| 4,899,309 | 2/1990 | Kitazawa et al. | 365/189.01 |
| 4,949,275 | 8/1990 | Nonaka | 364/490 |
| 5,060,046 | 10/1991 | Shintani | 257/206 |
| 5,119,313 | 6/1992 | Shaw et al. | 364/491 |
| 5,150,309 | 9/1992 | Shaw et al. | 364/491 |
| 5,282,148 | 1/1994 | Poirot et al. | 364/491 |
| 5,300,790 | 4/1994 | Hirabayashi et al. | 257/202 |
| 5,303,161 | 4/1994 | Burns et al. | 364/490 |
| 5,311,443 | 5/1994 | Crain et al. | 364/491 |
| 5,369,595 | 11/1994 | Gould et al. | 364/490 |
| 5,388,054 | 2/1995 | Tokumaru | 364/489 |
| 5,388,055 | 2/1995 | Tanizawa et al. | 364/489 |

FOREIGN PATENT DOCUMENTS

| | | | |
|---|---|---|---|
| 59-127848A | 7/1984 | Japan | 257/204 |
| 60-65546A | 4/1985 | Japan | 257/206 |
| 3-23667A | 1/1991 | Japan | 257/206 |
| 3-145762A | 6/1991 | Japan | 257/206 |

OTHER PUBLICATIONS

Hurst, Stanley L., *Custom VLSI Microelectronics*, Jan. 1992, Prentice Hall International; Cambridge, UK pp. 116–127.

*Primary Examiner*—Kevin J. Teska
*Assistant Examiner*—Jacques Louis-Jacques

[57] ABSTRACT

An integrated circuit device is provided, in which optimization design can be made for a short term to suppress power consumption of the integrated circuit device and improve the maximum operation frequency. First basic cells and second basic cells are disposed in a first direction. The second basic cells are the same in circuit function other than load driving capability as the first basic cells and the same in the cell width in the first direction and relative positions of input and output terminals. The first and second basic cells preferably contain MOS transistors, respectively, whose gate widths in the direction perpendicular to the cell width are made different from each other.

14 Claims, 5 Drawing Sheets

LAYOUT METHOD FOR DESIGNING AN INTEGRATED CIRCUIT DEVICE BY USING STANDARD CELLS

This is a continuation of application Ser. No. 08/054,107, filed Apr. 27, 1993, now abandoned.

BACKGROUND OF THE INVENTION

1. Field Of the Invention

This invention relates to an integrated circuit device and more particularly, to an integrated circuit device designed by a standard cell design method.

2. Description of the Related Art

The layout pattern design method called a "standard cell design method" is known as one of conventional design methods of an integrated circuit device. The standard cell design method is one by which first the patterns of basic circuits such as NAND gates and flip-flops are designed to provide basic cell patterns (simply, basic cells), and then such basic cells are laid out and interconnected as required to determine a desired layout of an integrated circuit device.

An integrated circuit device whose layout is designed by the standard cell design method is described below with reference to FIGS. 1 to 3.

FIG. 1 shows a layout pattern of a basic cell 100 of an inverter circuit of a CMOS (complementary metal oxide semiconductor) integrated circuit device. The basic cell 100 is made up of two transistors 4 and 6 arranged in the Y direction, each of which is of the same size as a predetermined basic insulated gate field effect transistor (hereinafter, referred to as an MOS transistor). Other basic cells 100' each having the same circuit function and the same driving capability as the basic cell 100 are contiguous to the basic cell 100 in the X direction. A large number of basic cells are thus disposed in the X direction.

The basic cell 100 includes a p-channel MOS transistor 4 and an n-channel MOS transistor 6 connected in series. $T_1$ denotes the cell width of the basic cell 100 in the X direction and $S_1$ denotes the cell length of the basic cell 100 in the Y direction.

The p-channel MOS transistor 4 is composed of p-type diffusion regions 2a and 2b which become source and drain regions, respectively, and a gate electrode 3. The n-channel MOS transistor 6 is composed of n-type diffusion regions 5a and 5b which become source and drain regions, respectively, and the gate electrode 3.

The p-type diffusion region 2a as the drain region of the p-channel MOS transistor 4 is connected through a contact 7a to a signal line 8 and through a contact 7b to the n-type diffusion region 5a which becomes the drain region of the n-channel MOS transistor 6.

The p-type diffusion region 2b as the source region of the p-channel MOS transistor 4 is connected through a contact 9 to a power line 12 which is common to the basic cells 100' contiguous to the basic cell 100. The n-type diffusion layer region 5b as the source region of the n-channel MOS transistor 6 is connected through a contact 13 to a ground line 14 which is common to the basic cells 100'.

An input terminal 15 is connected to a signal line 18 for connecting through a contact 17 to the common gate electrode An output terminal 16 is connected to the signal line 8. One end of the line 8 is connected through the contact 7a to the p-type diffusion region 2a and the other end thereof through the contact 7b to the n-type diffusion layer region 5a. The input terminal 15 and output terminal 16 are located each at predetermined distances in the X and Y directions from a cell center 50 which is the intersection of center lines in the X and directions.

FIG. 2 shows a layout pattern of a basic cell 200 having a driving capacity twice that of the basic cell 100. The basic cell 200 is of the same cell length $S_1$ as the basic cell 100, but is of cell width $T_2$ wider than the cell width $T_1$ of the basic cell 100. The basic cell 200 includes two transistor regions. 24 and 26 arranged in the Y direction. The basic cells 100' shown in FIG. 1 are contiguous to the basic cell 200 in the X direction.

In the transistor region 24, one p-channel MOS transistor is composed of a p-type diffusion region 22a which becomes a drain region, a p-type diffusion region 22b which becomes a source region, and a gate electrode 23a. The other p-channel MOS transistor is composed of the p-type diffusion region 22a which becomes a drain region, a p-type diffusion region 22c which becomes a source region, and a gate electrode 23b.

In the transistor region 25, one n-channel MOS transistor is composed of an n-type diffusion region 26a which becomes a drain region, an n-type diffusion region 25b which becomes a source region, and the gate electrode 23a. The other n-channel MOS transistor is composed of the n-type diffusion region 25a which becomes a drain region, an n-type diffusion region 25c which becomes a source region, and the Gate electrode 23b.

The p-type diffusion region 22a is connected through contact 7a to signal line 8 and through a contact 7b to the n-type diffusion region 25a.

The p-type diffusion regions 22b and 22c are respectively connected through contacts 9a and 9b to a power line 12 which is common to the basic cells 100' contiguous to the basic cell 200. The n-type diffusion regions 25b and 25c are respectively connected through contacts 13a and 13b to a ground line which is common to the basic cells 100'.

An input terminal 15 is connected to the signal line 18 for connecting through a contact 17 to the gate electrodes 23a and 23b. An output terminal 16 is connected to the signal line 8. One end of the line 8 is connected through the contact 7a to the p-type diffusion region 22a and the other end thereof through the contact 7b to the n-type diffusion region 25a.

To use the standard cell design method for laying out an integrated circuit device, if the basic transistor size is determined and a plurality of the basic transistors are aligned in one direction to form the basic cell, the height of the basic cell, layout of the power line for supplying power to the basic cells, and layout of an impurity-doped regions within the basic cell, or the like can be standardized and layout design of an integrated circuit device can be automated efficiently.

In this case, it is necessary to provide a large number of types of the basic cell not only by circuit function to cover any layout design of integrated circuit devices, but also by load driving capability to cover any timing design, such as the basic cells 100 and 200.

For layout design, the basic cell 100 having the same driving capability as a basic MOS transistor is selected for a part of light load to suppress power consumption of an integrated circuit device and the basic cell 200 having a driving capability higher than the basic MOS transistor is selected for a part of heavy load to prevent the maximum operation frequency of the integrated circuit device from deteriorating.

However, after layout of the integrated circuit device is designed, the basic cell 100 to which a larger wiring load is assigned due to the actual layout pattern is replaced with the basic cell 200 having the same circuit function and higher driving capability, and a part or the entirety of the wiring layout is modified according to the replacement.

Generally, the signal delay time and power consumption of integrated circuit device depend on the performance of the basic cells themselves constituting the integrated circuit device and the pads given to the output terminals of the basic cells. When the basic cells are allocated and wired automatically as described above, the locations and signal wiring length of the basic cells are not determined until pattern design is complete, thus the signal delay and power consumption which depend on the load given to the output terminals of the basic cells cannot accurately be known. As a result, even if the driving capability of the basic cells is optimized at the logical design stage, the target performance of the integrated circuit device at the beginning may often be unable to be guaranteed for the actual device.

Therefore, if after layout of an integrated circuit device is designed, wiring load depending on the actual layout pattern is also considered to evaluate the performance of the integrated circuit device, and the basic cells deteriorating the performance are specified for replacement with other basic cells having the same circuit functions and different load driving capabilities, optimum design of the integrated circuit device is enabled.

However, there are the following problems in the conventional layout design method.

FIG. 3A shows the state of the basic cell 101 to which larger wiring pad is assigned after completion of layout design using the basic cells 102 and 103. FIG. 3B shows a layout pattern after the basic cell 101 is replaced with the basic cell 101' having the high driving capability and same wiring is modified.

As shown in FIGS. 3A and 3B, the cell width of the basic cell 101 having the same driving capability as the basic transistor is two cell units, whereas the cell width of the basic cell 101' having the driving capability twice that of the basic transistor is three cell units. Therefore, a mismatch of cell width occurs between the basic cells 101 and 101'.

Besides, since the basic cells 101 and 101' which differ in relative positions of the input and output terminals within the cells are replaced, signal lines 27 between the basic cells are required to be moved from the first location shown in FIG. 3A to the location shown in FIG. 3B after replacement. The location of the signal lines 27 between the basic cells disposed in FIG. 3A is indicated by the dot lines in FIG. 3B.

Thus, if the basic cells 101 and 101' replaced differ in cell width and positions of the input and output terminals, reallocation and rewiring of the basic cells have an effect on not only the basic cells to be replaced, but also other basic cells 102 and 103 constituting the integrated circuit device.

Therefore, the basic cells are required to be again allocated and wired for the entire integrated circuit device from the beginning, and it takes long time to complete the final layout pattern.

SUMMARY OF THE INVENTION

Accordingly, it is an object of this invention to provide an integrated circuit device in which optimization design can be made for a short term to suppress power consumption of the integrated circuit device and to improve the maximum operation frequency thereof.

The integrated circuit device according to this invention comprises a plurality of first basic cells and a plurality of second basic cells, both of which are disposed in a first direction. The second basic cells are the same in circuit function other than the load driving capability as the first basic cells, and are the same in the cell width in the first direction and relative positions of input and output terminals.

Here, the "circuit function" includes any ones such as an NAND gate, flip-flops and the like.

In a preferred embodiment, each of the first and second basic cells contains an MOS transistor and CMOS transistor of the first basic cell is different in gate width in a second direction perpendicular to the first direction from that of the second basic cell. When the gate length of the transistors of the first and second basic cells are the same, different load driving capabilities can be easily obtained.

For providing different load driving capabilities for the first and second basic cells, the first and/or second basic cell may contain a bipolar transistor, or contain both an MOS and a bipolar transistors.

According to this invention, since the first and second basic cells have the same circuit function except for different load driving capabilities, the same cell width and the same relative positions of the input and output terminals, one basic cell can be easily replaced with another basic cell having a different load driving capability from each other.

Thus, optimization design to suppress power consumption of the integrated circuit device and improve the maximum operation frequency can be made for a short term.

DESCRIPTION OF THE PREFERRED EMBODIMENTS

Referring now to the accompanying drawings of FIGS. 4 and 5, preferred embodiments of this invention will be described.

[First embodiment ]

Figure 4:
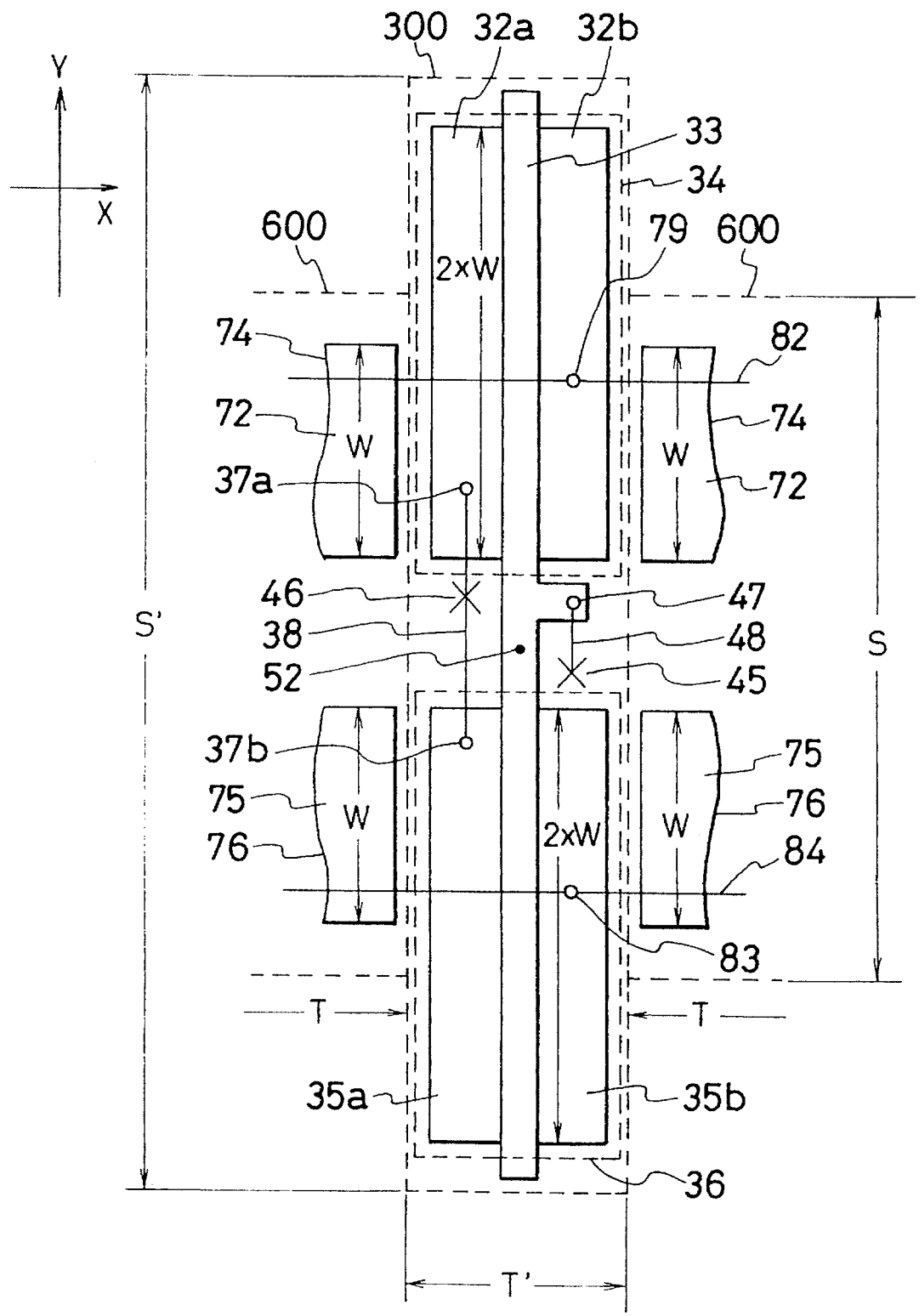
FIG. 4 schematically shows a layout pattern of basic cells for illustrating a first embodiment of this invention.

In FIG. 4, a first basic cell 600 for a specific inverter circuit in a CMOS integrated circuit device is replaced with second basic cell 300 having a higher driving capability than that of the cell 600. The first basic cell 600 thus replaced has a similar configuration to that of the basic cell 100 described in FIG. 1. First basic cells are contiguous to the second basic cell 300 in the X direction is each the same in circuit function as the first basic cell 600 replaced, but differs in load driving capability therefrom.

Here, the direction X is parallel to a direction along which the basic cells are aligned.

Each of the first basic cells 600 in FIG. 4 includes two transistors 74 and 76 aligned in the Y direction perpendicular to the X direction. Reference numerals 72 and 75 indicate source regions of the transistors 74 and 76, respectively.

The second basic cell 300 includes two transistors 34 and 36 aligned in the Y direction. In the cell 300, the p-channel MOS transistor 34 and the n-channel MOS transistor 36 are connected in series. The cell width of the cell 300 in the X direction, or T' is the same as that of the first basic cell 600, or T, but the cell length of the cell 300 in the Y direction, or S', is greater than that of the cell 600 in the Y direction, or S.

The gate width in the Y direction of each of the MOS transistors 34 and 36 is twice the gate width, or W, of each of the MOS transistors 74 and 76. The gate length in the X direction of each of the MOS transistors 34 and 36 is the same as that of each of the MOS transistors 74, 75 and 76.

In the second basic cell 300 having the higher load driving capability, the p-channel MOS transistor 34 is composed of a p-type diffusion regions 32a and 32b as source and drain regions which are twice as wide as those of the first basic cell 600, and the gate electrode 33 which is twice as wide as that of the cell 600. Thus, the transistor 34 has a load driving capability twice as large as that of the transistor 72 in the cell 600.

Similarly, the n-channel MOS transistor 36 is composed of an n-type diffusion regions 35a and 35b as source and drain regions which are twice as wide as those of the first basic cell 600, and the gate electrode 33. Thus, the transistor 36 has a load driving capability twice as large as that of the transistor 75 in the cell 600.

The p-type diffusion region 32a as the drain region of the p-channel MOS transistor 34 is connected through a contact 37a to a signal line 38 and through a contact 37b to the n-type diffusion region 35a as the drain region of the n-channel MOS transistor 36.

The p-type diffusion region 32b as the source region of the p-channel MOS transistor 34 is connected through a contact 79 to a power line 82 which is common to the first basic cells 600 contiguous to the second basic cell 300.

The n-type diffusion region 35b as the source region of the n-channel MOS transistor 36 is connected through a contact 83 to a ground line 84 which is common to the basic cells 600. An input terminal 45 is connected to a signal line 48 for connecting through a contact 47 to the gate electrode 33. An output terminal 46 is connected to a signal line 38, one end of which is connected through the contact 37a to the p-type diffusion region 32a and the other of which through the contact 37b to the n-type diffusion region 35a. The input terminal 45 and output terminal 46 are located each at predetermined distances in the X and Y directions from a cell center 52 which is the intersection of center lines in the X and Y directions.

Figure 1:
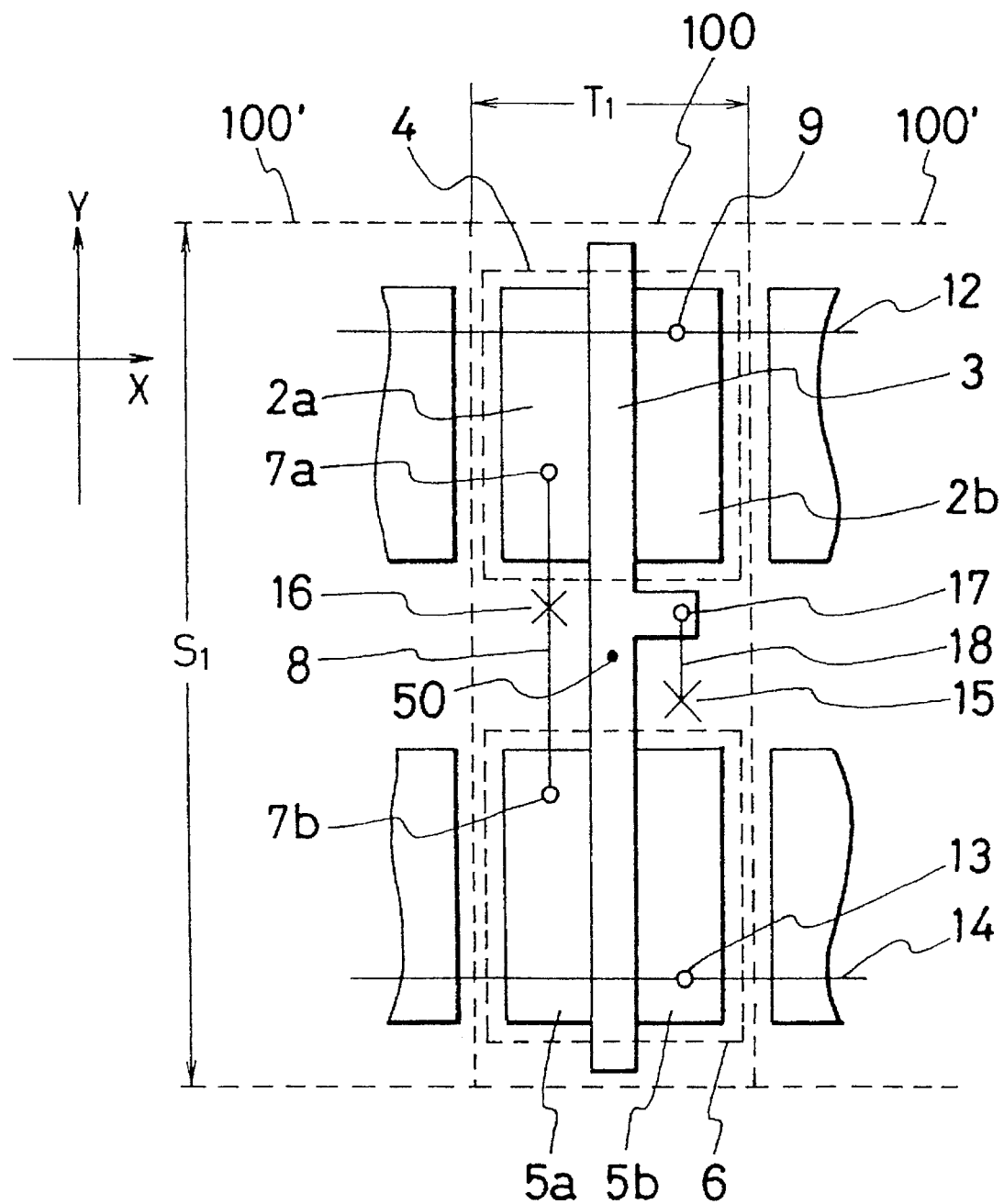
FIG. 1 schematically shows a layout pattern of basic cells of a conventional layout method for an integrated circuit device.
Figure 2:
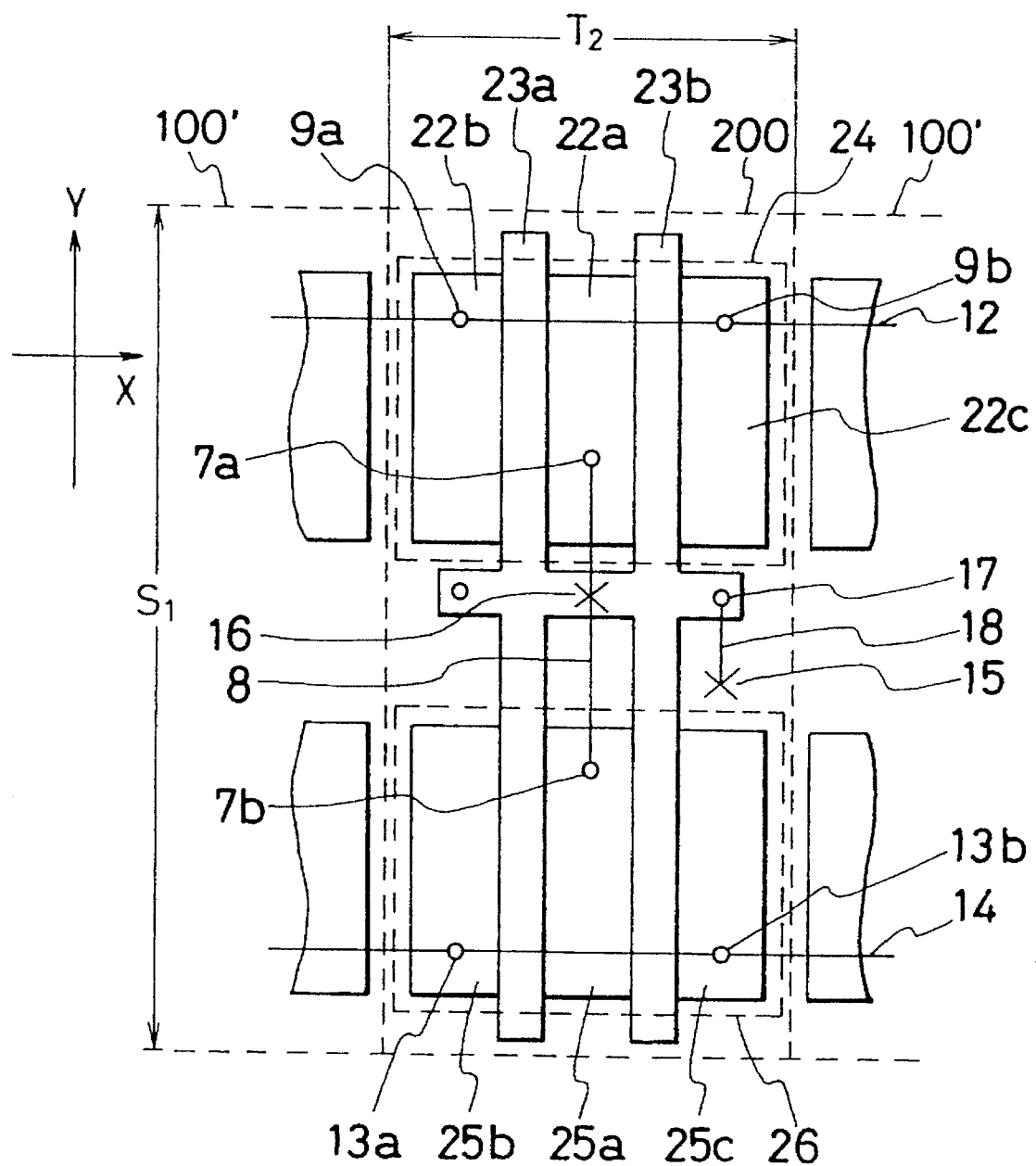
FIG. 2 schematically shows another layout pattern of basic cells of a conventional layout method for an integrated circuit device.
Figure 3A:
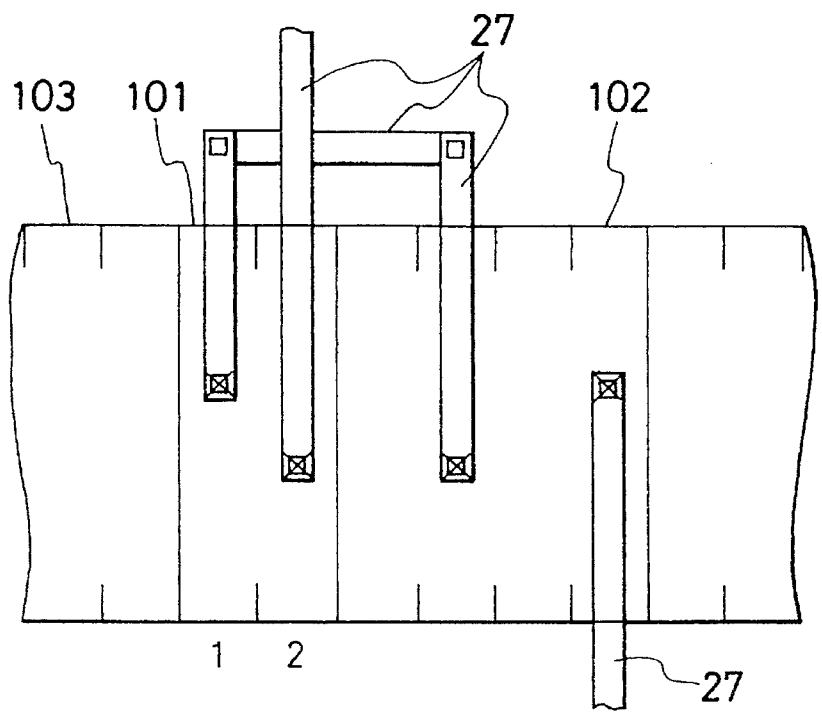
FIGS. 3A and 3B schematically show layout pattern for illustrating allocation and wiring of the basic cells.
Figure 3B:
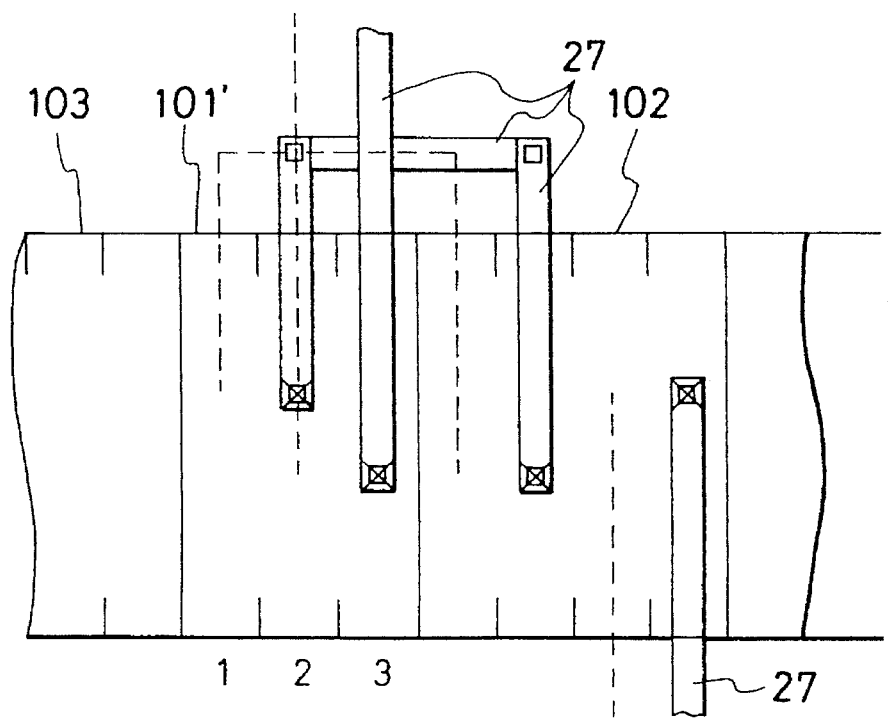

The distances in the X and Y directions from the cell center 52 of the second basic cell 300 to the input and output terminals 45 and 46 are the same as those from the center 50 in the basic cell 100 shown in FIG. 1, namely, also the same as those from each of the centers in the first basic cells 600 contiguous to the cell 300.

As described above, since the basic cell 300 having the high load driving capability is the same as the first basic cell 600 to be replaced in the cell width and the relative positions of the input and output terminals 45 and 46 to the cell center, the first basic cell 600 to which a larger wiring load is assigned than that estimated can be easily replaced with the second basic cell 300 after the disposition or arrangement of all the basic cells is complete.

Thus, after layout of an integrated circuit device is designed, the wiring loads of the respective basic cells depending on the actual layout pattern can be also considered to evaluate performance of the integrated circuit device and the basic cells deteriorating the performance can be specified for replacement with other basic cells having the same circuit functions and different load driving capabilities.

Therefore, optimum design of the integrated circuit device is enabled in a short term.

[Second embodiment]

Figure 5:
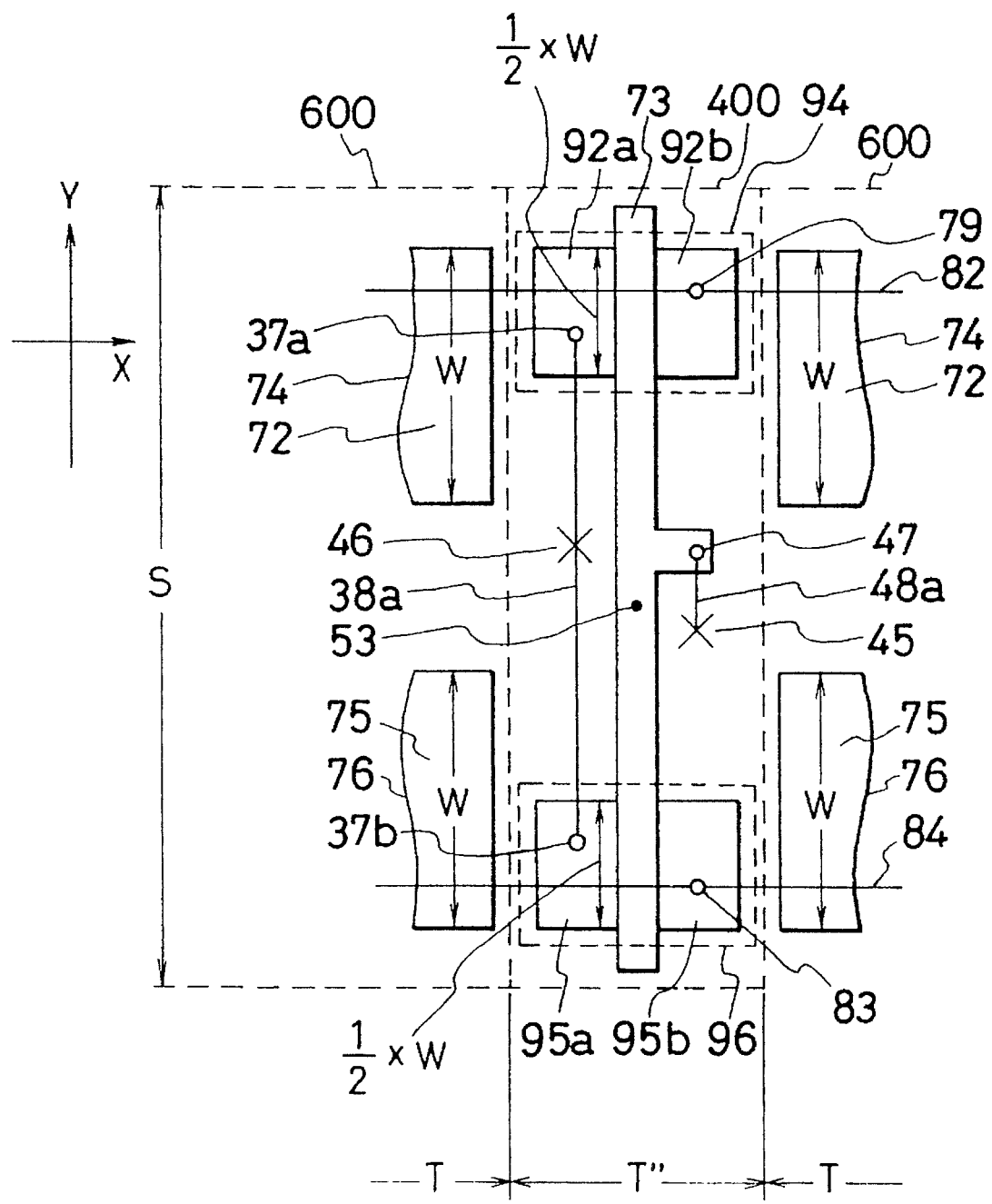
FIG. 5 schematically shows a layout pattern of basic cells for illustrating a second embodiment of this invention.

FIG. 5 shows a layout pattern of a basic cell for illustrating a second embodiment of this invention.

In the second embodiment, in contrast to the first embodiment, a first basic cell 600 for a specific inverter circuit in a CMOS integrated circuit device is replaced with a third basic cell 400 having a lower driving capability than that of the first basic cell 600. Parts identical with those previously described with reference to FIG. 4 are denoted by the same reference numerals in FIG. 5.

The third basic cell 400 includes two MOS transistors 94 and 96 aligned in the Y direction, each of which has smaller size than that in the first basic cell 600. The first basic cells 600 are contiguous in the X direction to the third basic cell 400 having the lower load driving capability.

The cell width of the third basic cell 400 in the X direction, or T", is the same as that of the first basic cell 600, or T, and the cell length of the third basic-cell 400 in the Y direction is also the same as that of the basic cell 600 in the Y direction.

The distances in the X and Y directions from a cell center 53, which is the intersection of center lines in the X and Y directions of the third basic cell 400, to the input and output terminals 45 and 46 are the same as those from the center in the first basic cell 600.

On the other hand, the gate width of each of the MOS transistors 94 and 96 in the third basic cell 400 is a half of the gate width, or W, in the Y direction of each of the MOS transistors 74 and 76 in the first basic cell 600. The gate length in the direction of each of the MOS transistors 94 and 96 is the same as that of each of the MOS transistors 74 and 76.

In the third basic cell 400 having the lower load driving capability, the p-channel MOS transistor 94 is composed of a p-,type diffusion regions 92a and 92b as source and drain regions which are half as wide as those of the first basic cell 600, and the gate electrode 73. Thus, the transistor 94 has a load driving capability half as large as that of the transistor 72 in the cell 600.

Similarly, the n-channel MOS transistor 96 is composed of an n-type diffusion regions 95a and 95b as source and drain regions which are half as wide as those of the first basic cell 600, and the gate electrode 73. Thus, the transistor 96 also has a load driving capability half as large as that of the transistor 75 in the cell 600.

The p-type diffusion region 92a as the drain region of the p-channel MOS transistor 94 is connected through a contact 37a to signal wiring 38a and through a contact 37b to the n-type diffusion region 95a as the drain region of the n-channel MOS transistor 96.

The p-type diffusion region 92b as the source region of the p-channel MOS transistor 94 is connected through a contact 79 to a power line which is common to the first basic cells 600 contiguous to the third basic cell 400. The n-type diffusion region 95b as the source region of the n-channel MOS transistor 96 is connected through a contact 83 to a ground line 84 which is common to the basic cells 600.

The input terminal 45 is connected to a signal line 48a for connecting through a contact 47 to the gate electrode 73. The output terminal 46 is connected to a signal line 38, one end of which is connected through the contact 37a to the p-type diffusion region 92a and the other end of which through the contact 37b to the n-type diffusion region 95a.

The input terminal 45 and the output terminal 46 are located each at predetermined distances in the X and Y directions from a cell center 53 which is the intersection of center lines in the X and Y directions.

The distances in the X and Y directions from the cell center 53 of the third basic cell 400 to the input and output terminals 45 and 46 are the same as those from the center 50 in the first basic cell 100 shown in FIG. 1, namely, also the same as those from each of the centers in the first basic cells 600 contiguous to the basic cell 400.

Similar to the first embodiment, since the third basic cell 400 having the lower load driving capability in this embodiment is the same as the first basic cell 600 to be replaced in the cell width and the relative positions of the input and output terminals 45 and 46, the basic cells 400 and 600 can be easily replaced with each other after the disposition or arrangement of all the basic cells of the integrated circuit device is complete.

Thus, also in the second embodiment, optimization design to suppress power consumption of the integrated circuit device and improve the maximum operation frequency can be made for a short term.

Although CMOS circuits are discussed in the above first and second embodiments, this invention is applicable to an integrated circuit device made of basic cells in which basic bipolar transistors whose emitter areas are standardized are disposed regularly. It is also applicable to an integrated circuit device made of basic cells in which MOS and bipolar transistors are mixed.

It is to be understood that this invention is not limited to the embodiments except as defined in the appended claims.

What is claimed is:

1. A layout method of a semiconductor integrated circuit device, comprising the steps of:

(a) preparing first basic cells and second basic cells,
  each of said first basic cells having a first reference point and each of said second basic cells having a second reference point,
  each of said second basic cells having the same circuit function and the same cell width as those of each of said first basic cells,
  each of said second basic cells having the same relative position of a signal input terminal to said second reference point as that of each of said first basic cells to said first reference point,
  each of said second basic cells having the same relative position of a signal output terminal to said second reference point as that to said first reference point of each of said first basic cells, and
  each of said second basic cells having a different load driving capability from that of each of said first basic cells;

(b) providing layouts of said first basic cells and interconnections therebetween to obtain a desired function of said semiconductor integrated circuit device,
  said first basic cells being aligned in a first direction so that cell width directions of said first basic cells are kept in said first direction,
  adjacent two ones of said first basic cells being in contact with each other;

(c) evaluating an obtainable performance of said first basic cells whose layouts have been provided in said step (b) to determine whether or not any of said first basic cells deteriorate said performance regarding load driving capability;
  said performance of said first basic cells being evaluated in consideration with respective loads connected to individual signal output terminals of said first basic cells;
  said respective loads of said first basic cells being determined by said layouts provided in said step (b);

(d) specifying an unsuitable cell having an unsuitable load driving capability which deteriorates said performance from said first basic cells whose layouts have been provided in said step (b) in accordance with said respective loads and said driving capabilities of said first basic cells, obtained in said step (c); and (e) replacing said unsuitable cell of said first basic cells specified in said step (d) with one of said second basic cells without changing said layouts of said interconnections between said first basic cells, wherein
  said second reference point of said one of second basic cells to replace said unsuitable cell is positioned on said first reference point of said unsuitable cell.

2. A layout method of a semiconductor integrated circuit device as claimed in claim 1, wherein each of said second basic cells has a different cell length in a second direction perpendicular to said first direction from that of each of said first basic cells corresponding to the difference in load driving capability.

3. A layout method of a semiconductor integrated circuit device as claimed in claim 2, wherein each of said second basic cells has the same relative position of a pair of power supply terminals to said second reference point as that of each of said first basic cells to said first reference point.

4. A layout method of a semiconductor integrated circuit device as claimed in claim 1, wherein each of said first basic cells includes a first insulated-gate field effect transistor and each of said second basic cells includes a second insulated-gate field effect transistor;

said first transistor of each of said first basic cells being different from said second transistor of each of said second basic cells in an effective gate width in said second direction; and said first transistor of each of said first basic cells being the same as said second transistor of each of said second basic cells in an effective gate length in said first direction;

said first transistor of each of said first basic cells being different from said second transistor of each of said second basic cells in a ratio of said effective gate width to said effective gate length, providing different load driving capabilities.

5. A layout method of a semiconductor integrated circuit device as claimed in claim 4, wherein said first transistor of each of said first basic cells has diffusion regions as source and drain regions and said effective gate width thereof is defined as a width of said source and drain regions in said second direction;

and wherein said second transistor of each of said second basic cells has diffusion regions as source and drain regions and said effective gate width thereof is defined as a width of said source and drain regions in said second direction.

6. A layout method of a semiconductor integrated circuit device, comprising the steps of:

(a) preparing first basic cells and second basic cells,
  each of said first basic cells having a first reference point and each of said second basic cells having a second reference point,
  each of said second basic cells having the same circuit function and the same cell width as those of each of said first basic cells, each of said second basic cells having the same relative position of a signal input terminal to said second reference point as that of each of said first basic cells to said first reference point;

each of said second basic cells having the same relative position of a signal output terminal to said second reference point as that of each of said first basic cells to said first reference point, and each of said second basic cells having a different load driving capability from that of each of said first basic cells;

(b) providing layouts of said first basic cells and interconnections therebetween to obtain a desired function of said semiconductor integrated circuit device, said first basic cells being aligned in a first direction so that cell width directions of said first basic cells are kept in said first direction;

adjacent two ones of said first basic cells being in contact with each other;

(c) evaluating an obtainable performance of said first basic cells whose layouts have been provided in said step (b) to determine whether or not any of said first basic cells have a load driving capability which deteriorates said performance;

said performance of said first basic cells being evaluated in consideration with respective loads connected to individual signal output terminals of said first basic cells;

said respective loads of said first basic cells being determined by said layouts provided in said step (b);

(d) specifying an unsuitable cell having an unsuitable load driving capability which deteriorates said performance from said first basic cells whose layouts have been provided in said step (b) in accordance with said respective loads and said driving capabilities of said first basic cells, obtained in said step (c); and (e) replacing said unsuitable cell of said first basic cells specified in said step (d) with one of said second basic cells without changing said layouts of said interconnections between said first basic cells, wherein said second reference point of said one of second basic cells to replace said unsuitable cell is positioned on said first reference point of said unsuitable cell; and wherein:

each of said first basic cells includes first and second insulated-gate field effect transistors arranged along a second direction perpendicular to said first direction, gate electrodes of said first and second transistors are connected in common to said signal input terminal of the corresponding one of said first basic cells, and one of source and drain regions of a first transistor and one of source and drain regions of a second transistor of each of said first basic cells are connected in common to said signal output terminal of the corresponding one of said first basic cells;

each of said second basic cells includes third and fourth insulated-gate field effect transistors arranged along said second direction, gate electrodes of said third and fourth transistors are connected in common to said signal input terminal of the corresponding one of said second basic cells, and one of source and drain regions of a third transistor and one of source and drain regions of a fourth transistor of each of said second basic cells are connected in common to said signal output terminal of the corresponding one of said second basic cells;

said first transistor and said second transistor of each of said first basic cells are the same in the effective gate width in said first direction and said third transistor and said fourth transistor of each of said second basic cells are the same in the effective gate width in said first direction;

said first and second transistors of each of said first basic cells are different from said third and fourth transistors of each of said second basic cells in the effective gate width in said second direction; and said first and second transistors of each of said first basic cells are the same as said third and fourth transistors of each of said second basic cells in the effective gate length in said first direction;

said first and second transistors of each of said first basic cells being different from said third and fourth transistors of each of said second basic cells in a ratio of said effective gate width to said effective gate length, providing different load driving capabilities.

7. A layout method of a semiconductor integrated circuit device as claimed in claim 6, wherein said first transistor of each of said first basic cells and said third transistor of each of said second basic cells are p-channel transistors and said second transistor of each of said first basic cells and said fourth transistor of each of said second basic cells are n-channel transistors, so as to provide a CMOS inverter function of the integrated circuit device.

8. A layout method of a semiconductor integrated circuit device, comprising the steps of:

(a) preparing first basic cells, second basic cells and third basic cells, each of said first basic cells having a first reference point and each of said second basic cells having a second reference point, each of said second basic cells having the same circuit function and the same cell width as those of each of said first basic cells, each of said second basic cells having the same relative position of a signal input terminal to said second reference point as that of each of said first basic cells to said first reference point;

each of said second basic cells having the same relative position of a signal output terminal to said second reference point as that of each of said first basic cells to said first reference point, and each of said third basic cells having a third reference point and the same circuit function, the same cell width and the same relative position of a signal input terminal to said third reference point as those of each of said first basic cells, and each of said third basic cells having a smaller load driving capability than that of each of said first basic cells;

(b) providing layouts of said first basic cells and interconnections thereof to obtain a desired function of said semiconductor integrated circuit device, said first basic cells being aligned in a first direction so that cell width directions of said first basic cells are kept in said first direction, adjacent two ones of said first basic cells being in contact with each other;

(c) evaluating an obtainable performance of said first basic cells whose layouts have been provided in said step (b) to determine whether or not any of said first basic cells have a load driving capability which deteriorates said performance;

said performance of said first basic cells being evaluated in consideration with respective loads connected to individual signal output terminals of said first basic cells;

said respective loads of said first basic cells being determined by said layouts obtained in said step (b);

(d) specifying an unsuitable cell having an unsuitable load driving capability which deteriorates said performance from said first basic cells whose layouts have been provided in said step (b) in accordance with said respective loads and said driving capabilities of said first basic cells obtained in said step (c); and (e) replacing said unsuitable cell of said first basic cells specified in said step (d) with one of said second basic cells or with one of said third basic cells corresponding to said evaluation results obtained in said step (c) without changing said layouts of said interconnections between said first basic cells, wherein said second reference point of said one of second basic cells or said third reference point of said one of third basic cells to replace said unsuitable cell is positioned on said first reference point of said unsuitable cell.

9. A layout method of a semiconductor integrated circuit device as claimed in claim 8, wherein each of said second basic cells has a larger cell length in a second direction perpendicular to said first direction from that of each of said first basic cells corresponding to a difference therebetween in a load driving capability, and each of said third basic cells has a smaller cell length in said second direction from that of each of said first basic cells corresponding to a difference therebetween in load driving capability.

10. A layout method of a semiconductor integrated circuit device as claimed in claim 9, wherein each of said second basic cells has the same relative position of a pair of power supply terminals to said second reference point as that of each of said first basic cells to said first reference point; and each of said third basic cells has the same relative position of a pair of power supply terminals to said third reference point as that of each of said first basic cells to said first reference point.

11. A layout method of a semiconductor integrated circuit device as claimed in claim 8, wherein each of said first basic cells includes a first insulated-gate field effect transistor, each of said second basic cells includes a second insulated-gate field effect transistor, and each of said third basic cells includes a third insulated-gate field effect transistor;

each said second transistor being larger than each said first transistor in an effective gate width in said second direction, and each said third transistor being smaller than each said first transistor in an effective gate width in said second direction; and each said second transistor being the same as each said first transistor in an effective gate length in said first direction, and each said third transistor being the same as each said first transistor in an effective gate length in said first direction;

wherein each said second transistor is larger than each said first transistor in a ratio of said effective gate width to said effective gate length, providing a larger load driving capability of each said second transistor than that of each said first transistor, and wherein each said third transistor is smaller than each said first transistor in a ratio of said effective gate width to said effective gate length, providing a smaller load driving capability of each said third transistor than that of each said first transistor.

12. A layout method of a semiconductor integrated circuit device as claimed in claim 11, wherein each said first transistor has diffusion regions as source and drain regions and said effective gate width thereof is defined as a width of said source and drain regions in said second direction;

and wherein each said second transistor has diffusion regions as source and drain regions and said effective gate width thereof is defined as a width of said source and drain regions in said second direction, and wherein each said third transistor has diffusion regions as source and drain regions and said effective gate width thereof is defined as a width of said source and drain regions in said second direction.

13. A layout method of a semiconductor integrated circuit device, comprising the steps of:

(a) preparing first basic cells, second basic cells and third basic cells, each of said first basic cells having a first reference point and each of said second basic cells having a second reference point, each of said second basic cells having the same circuit function and the same cell width as those of each of said first basic cells, each of said second basic cells having the same relative position of a signal input terminal to said second reference point as that of each of said first basic cells to said first reference point, each of said second basic cells having the same relative position of a signal output terminal to said second reference point as that of each of said first basic cells to said first reference point, and each of said third basic cells having a third reference point and same circuit function, the same cell width and the same relative position of a signal input terminal to said third reference point as those of each of said first basic cells, and each of said third basic cells having a smaller load driving capability than that of each of said first basic cells;

(b) providing layouts of said first basic cells and interconnections thereof to obtain a desired function of said semiconductor integrated circuit device, said first basic cells being aligned in a first direction so that cell width directions of said first basic cells are kept in said first direction;

adjacent two ones of said first basic cells being in contact with each other;

(c) evaluating an obtainable performance of said first basic cells whose layouts have been provided in said step (b) to determine whether or not any of said first basic cells have a load driving capability which deteriorates said performance, said performance of said first basic cells being evaluated in consideration with respective loads connected to individual signal output terminals of said first basic cells;

said respective loads of said first basic cells being determined by said layouts provided in said step (b);

(d) specifying an unsuitable cell having an unsuitable load driving capability which deteriorates said performance from said first basic cells whose layouts have been provided in said step (b) in accordance with said respective loads and said load driving capabilities of said first basic cells, obtained in said step (c); and (e) replacing said unsuitable cell of said first basic cells specified in said step (d) with one of said second basic cells or with one of said third basic cells corresponding to said evaluation results obtained in said step (c) without changing said layouts of said interconnections between said first basic cells, wherein said second reference point of said one of second basic cells or said third reference point of said one of third basic cells to replace said unsuitable cell is positioned on said first reference point of said unsuitable cell; and wherein:

each of said first basic cells includes first and second insulated-gate field effect transistors arranged along a second direction perpendicular to said first direction, gate electrodes of said first and second transistors being connected in common to said signal input terminal of a corresponding one of said first basic cells, and one of source and drain regions of a first transistor and one of source and drain regions of a second transistor of each of said first basic cells being connected in common to said signal output terminal of a corresponding one of said first basic cells;

each of said second basic cells includes third and fourth insulated-gate field effect transistors arranged along said second direction, gate electrodes of said third and fourth transistors being connected in common to said signal input terminal of a corresponding one of said second basic cells, and one of source and drain regions of a third transistor and one of source and drain regions of a fourth transistor of each of said second basic cells being connected in common to said signal output terminal of the corresponding one of said second basic cells;

each of said third basic cells includes fifth and sixth insulated-gate field effect transistors arranged along said second direction, gate electrodes of said fifth and sixth transistors being connected in common to said signal input terminal of a corresponding one of said third basic cells, and one of source and drain regions of a fifth transistor and one of source and drain regions of a sixth transistor of each of said third basic cells being connected in common to said signal output terminal of the corresponding one of said third basic cells;

each said first transistor and each said second transistor are the same in the effective gate width in said first direction, each said third transistor and each said fourth transistor are the same in the effective gate width in said first direction and each said fifth transistor and each said sixth transistor are the same in the effective gate width in said first direction;

said third and fourth transistors of each of said second basic cells are larger than said first and second transistors of each of said first basic cells in the effective gate width in said second direction;

said fifth and sixth transistors of each of said third basic cells are smaller than said first and second transistors of each of said first basic cells in the effective gate width in said second direction; and said third and fourth transistors of each of said second basic cells are the same as said first and second transistors of each of said first basic cells in the effective gate length in said first direction, and said fifth and sixth transistors of each of said third basic cells are the same as said first and second transistors of each of said first basic cells in the effective gate length in said first direction;

said third and fourth transistors of each of said second basic cells being larger than said transistor of each of said first basic cells in a ratio of said effective gate width to said effective gate length, providing a larger load driving capabilities of said third and fourth transistors than that of said first and second transistors, and said fifth and sixth transistors of each of said third basic cells being smaller than said first and second transistors of each of said first basic cells in a ratio of said effective gate width to said effective gate length, providing a smaller load driving capability than that of said first and second transistors.

14. A layout method of a semiconductor integrated circuit as claimed in claim 13, wherein said first transistor of each of said first basic cells, said third transistor of each of said second basic cells and said fifth transistor of each of said third basic cells are p-channel transistors and said second transistor of each of said first basic cells, said third transistor of each of said second basic cells and said sixth transistor of each of said third basic cells are n-channel transistors so as to provide a CMOS inverter function to said integrated circuit device.

* * * * *